(12) United States Patent
Balteanu et al.

(10) Patent No.: US 10,170,989 B2
(45) Date of Patent: Jan. 1, 2019

(54) METHODS FOR FABRICATING AN INTEGRATED CIRCUIT WITH A VOLTAGE REGULATOR

(71) Applicant: SKYWORKS SOLUTIONS, INC., Woburn, MA (US)

(72) Inventors: Florinel G. Balteanu, Irvine, CA (US); Jakub F. Pingot, Ottawa (CA); Peter Harris Robert Popplewell, Ottawa (CA)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/415,185

(22) Filed: Jan. 25, 2017

(65) Prior Publication Data

US 2017/0131734 A1    May 11, 2017

Related U.S. Application Data

(62) Division of application No. 13/225,124, filed on Sep. 2, 2011, now Pat. No. 9,588,529.
(Continued)

(51) Int. Cl.
*H02M 3/158* (2006.01)
*G05F 1/56* (2006.01)
(Continued)

(52) U.S. Cl.
CPC .............. *H02M 3/158* (2013.01); *G05F 1/56* (2013.01); *G05F 3/242* (2013.01); *G05F 3/262* (2013.01);
(Continued)

(58) Field of Classification Search
None
See application file for complete search history.

(56) References Cited

U.S. PATENT DOCUMENTS

| 5,493,207 A | 2/1996 | Beasom |
| 5,796,296 A * | 8/1998 | Krzentz ................. G05F 3/247 327/530 |

(Continued)

OTHER PUBLICATIONS

International Preliminary Report on Patentability for International Application No. PCT/US2011/050399 filed on Sep. 2, 2011. (7 pages).

(Continued)

*Primary Examiner* — Mohammed Rachedine
(74) *Attorney, Agent, or Firm* — Knobbe Martens Olson & Bear LLP

(57) ABSTRACT

Methods for fabricating an integrated circuit with a voltage regulator are provided. In some implementations, a method includes forming a primary regulator on a semiconductor substrate, including fabricating a switch, fabricating an amplifier for controlling the switch, and fabricating a voltage generator for biasing the amplifier to operate the primary regulator in a bypass mode or in a regulating mode. The method further includes forming an input terminal and an output terminal of the primary regulator on the semiconductor substrate, forming a secondary regulator on the substrate, forming an input terminal and an output terminal of the secondary regulator on the semiconductor substrate, and forming an electrical connection between the output terminal of the primary regulator and the input terminal of the secondary regulator.

20 Claims, 7 Drawing Sheets

Related U.S. Application Data

(60) Provisional application No. 61/379,956, filed on Sep. 3, 2010.

(51) Int. Cl.

| | | |
|---|---|---|
| *G05F 3/24* | (2006.01) | |
| *H03F 3/189* | (2006.01) | |
| *H03F 3/20* | (2006.01) | |
| *H04B 1/40* | (2015.01) | |
| *G05F 3/26* | (2006.01) | |
| *H01L 21/8234* | (2006.01) | |
| *H01L 23/528* | (2006.01) | |
| *H01L 27/06* | (2006.01) | |

(52) U.S. Cl.
CPC .... *H01L 21/823475* (2013.01); *H01L 23/528* (2013.01); *H01L 27/0629* (2013.01); *H03F 3/189* (2013.01); *H03F 3/20* (2013.01); *H04B 1/40* (2013.01); *Y10T 29/41* (2015.01)

(56) References Cited

U.S. PATENT DOCUMENTS

| | | |
|---|---|---|
| 6,362,606 B1 | 3/2002 | Dupuis et al. |
| 7,786,712 B2 | 8/2010 | Williams |
| 8,774,739 B2 | 7/2014 | Ripley |
| 9,588,529 B2 | 3/2017 | Balteanu et al. |
| 2002/0146993 A1 | 10/2002 | Persico |
| 2003/0090305 A1 | 5/2003 | Kobayashi et al. |
| 2006/0270366 A1 | 11/2006 | Rozenblit et al. |
| 2007/0200539 A1* | 8/2007 | Ganti .................. G05F 1/56 323/282 |
| 2008/0157733 A1 | 7/2008 | Williams |
| 2008/0158915 A1 | 7/2008 | Williams |
| 2008/0180169 A1 | 7/2008 | Ripley et al. |
| 2009/0091309 A1 | 4/2009 | Balakrishnan et al. |
| 2009/0096531 A1 | 4/2009 | Shimamoto et al. |
| 2009/0195229 A1 | 8/2009 | Balakrishnan et al. |
| 2009/0237055 A1 | 9/2009 | Sakai |
| 2009/0273327 A1 | 11/2009 | Ito et al. |
| 2010/0019806 A1 | 1/2010 | Bien |
| 2010/0109624 A1* | 5/2010 | Lourens ................ G05F 1/575 323/280 |
| 2012/0182074 A1 | 7/2012 | Ripley et al. |
| 2017/0131735 A1 | 5/2017 | Balteanu et al. |
| 2017/0133935 A1 | 5/2017 | Balteanu et al. |

OTHER PUBLICATIONS

PCT Search Report dated May 10, 2012 for International Application No. PCT/US2011/050399 filed Sep. 2, 2011. (11 pages).

\* cited by examiner

METHODS FOR FABRICATING AN INTEGRATED CIRCUIT WITH A VOLTAGE REGULATOR

RELATED APPLICATIONS

The present application is a divisional of U.S. application Ser. No. 13/225,124, filed Sep. 2, 2011, titled "HIGH-VOLTAGE TOLERANT VOLTAGE REGULATOR," which claims the benefit of priority under 35 U.S.C. § 119(e) of U.S. Provisional Application No. 61/379,956, filed on Sep. 3, 2010, entitled "HIGH VOLTAGE-TOLERANT VOLTAGE REGULATOR," each of which are herein incorporated by reference in their entireties.

BACKGROUND

Field

The present disclosure generally relates to battery-operated systems, and, more particularly, to voltage regulators for battery operated systems.

Description of the Related Art

Mobile telephones and other portable systems are typically powered by a rechargeable battery, such as a lithium-ion (Li-ion) battery. These batteries are popular because they have high energy density suitable for extended operation of the portable device. When the batteries need to be charged, the portable device can be connected to a charger that plugs into a power source such as an outlet or a vehicle's power system. However, to charge the battery, the voltage from the charger (e.g., 5.5 or more volts) can be significantly greater than the normal operating voltage of the battery (e.g., 2.3-4.5 volts). Since a user of the portable device may want to be able to use the device when it is being charged, the circuitry in the device needs to be able to handle the higher than normal voltages present during charging.

Unfortunately, much of the circuitry in the portable device is made using integrated circuit technologies that may not be able to be directly powered via the battery. As transistor feature sizes decrease, the components (e.g., MOSFETs) on the integrated circuit can break down at voltages well below the maximum voltage that the battery will experience. One solution to this problem is to use voltage regulators that step-down the battery voltage to a voltage that the integrated circuits can safely tolerate.

SUMMARY

In some implementations, the present disclosure relates to a voltage regulator circuit that includes a switch coupled to an input node and an output node. The voltage regulator circuit further includes a regulation circuit coupled to the input and output nodes and the switch. The regulation circuit is configured to put the switch in a first state or a second state. The switch is configured so that when in the first state, the regulation circuit receives an input voltage from the input node and provides a first output voltage to the output node, and when in the second state, the regulation circuit is bypassed such that the input voltage from the input node is provided to the output node substantially as an output voltage.

According to some embodiments, the regulation circuit can be configured to put the switch in the first state when the input voltage is greater than a selected voltage. In some embodiments, the first output voltage corresponding to the first state can be substantially constant. In some embodiments, the first output voltage can be less than or equal to the input voltage. In some embodiments, the regulation circuit can be configured to put the switch in the second state when the input voltage is less than or equal to the selected voltage.

In a number of embodiments, the switch can include a pass transistor configured to be controlled by a control signal from the regulation circuit. In some embodiments, the pass transistor includes a MOSFET such as a P-channel MOSFET or an N-channel MOSFET.

In accordance with some embodiments, the regulation circuit can include a voltage generator and a differential amplifier, with the voltage generator configured to receive the input voltage from the input node and provide a reference voltage and one or more bias voltages to the differential amplifier, and the differential amplifier configured to generate the control signal for the pass transistor. The generator can include first and second strings of transistors, with the first string including a plurality of series-coupled transistor and one or more taps configured to generate the one or more bias voltages. In some embodiments, the second string can include a plurality of cascode-coupled transistors coupled to the first string so as to mirror a current flowing in the first string and generate the reference voltage. In some embodiments, the second string can include a bandgap voltage circuit configured to generate the reference voltage having reduced dependence on temperature and input voltage variations.

In a number of embodiments, the regulation circuit can further include a voltage divider configured to form a closed loop with the differential amplifier and the pass transistor so as to yield a regulated voltage that substantially matches a voltage proportional to the reference voltage. In some embodiments, the regulated voltage can be substantially equal to the first output voltage at the output node. In some embodiments, the voltage divider can include a plurality of transistors connected in series.

According to a number of implementations, the present disclosure relates to an integrated circuit formed on a die. The integrated circuit includes a regulator circuit formed on the die and having an input terminal for receiving an input voltage and an output terminal for outputting an output voltage. The regulator circuit is configured to be capable of being in a regulation mode in which the regulator circuit outputs a regulated voltage as the output voltage. The regulator circuit is further configured to be capable of being in a bypass mode in which the regulator circuit outputs a bypass voltage as the output voltage. The integrated circuit further includes a powered circuit formed on the die and having an input terminal for receiving the output voltage of the regulator circuit. The integrated circuit further includes an electrical connection formed on the die and configured to connect the output terminal of the regulator circuit and the input terminal of the powered circuit.

In some embodiments, the powered circuit can include a power amplifier circuit. In some embodiments, the integrated circuit can further include a second regulator configured to receive the output voltage of the regulator circuit as an input and generate a second output voltage for a second powered circuit. Such a second powered circuit can include a transmit-receive switch circuit.

In a number of implementations, the present disclosure relates to a transceiver module having a transceiver circuit configured to generate a radio-frequency (RF) signal and to process a received RF signal. The module further includes a power amplifier circuit interconnected to the transceiver circuit and configured to receive an input RF signal and generate an amplified RF signal. The module further includes a voltage regulator circuit interconnected to the power amplifier circuit and configured to provide a desired voltage to the power amplifier circuit. The voltage regulator circuit is further configured to be capable of being in a regulation mode in which the desired voltage includes a regulated voltage. The voltage regulator circuit is further configured to be capable of being in a bypass mode in which the desired voltage includes a bypass voltage.

In some embodiments, the regulated voltage can include a voltage having a substantially constant selected value. Such a bypass voltage can be substantially proportional to the input voltage. In some embodiments, the module can further include a packaging structure configured to provide protection for the circuits of the module. In some embodiments, the input RF signal provided to the power amplifier circuit can include a transmit RF signal.

As taught herein, some implementations of the present disclosure relates to a wireless device having at least one antenna configured to facilitate transmission and receiving of radio-frequency (RF) signals. The wireless device further includes a transceiver interconnected to the antenna and configured to generate an RF signal for transmission through the antenna and to process an RF signal received from the antenna. The wireless device further includes a voltage regulator interconnected to the transceiver and configured to provide a desired voltage to the transceiver. The voltage regulator is further configured to be capable of operating in a regulation mode in which the desired voltage includes a regulated voltage. The voltage regulator is further configured to be capable of operating in a bypass mode in which the desired voltage includes a bypass voltage. In some embodiments, the wireless device can further include a receptacle configured to receive a battery and to provide electrical connection between the battery and the voltage regulator such that the input voltage of the voltage regulator is approximately proportional to the battery's voltage.

In some implementations, the present disclosure relates to a method for regulating voltage in a battery powered wireless device. The method includes receiving an input voltage and regulating the input voltage so as to yield a regulated voltage if the input voltage is greater than a selected voltage and bypassing the regulating if the input voltage is less than or equal to the selected voltage.

According to some implementations, the present disclosure relates to a method for fabricating an integrated circuit. The method includes forming a regulator circuit on a semiconductor substrate. The regulator circuit includes a switch that allows the regulator circuit to operate in a regulating mode and a bypass mode. The method further includes forming a powered circuit on the same semiconductor substrate. The method further includes forming one or more electrical connections between the regulator circuit and the powered circuit so as to allow the regulator circuit to provide power to the powered circuit when the regulator circuit is operating in either of the regulating and bypass modes.

In a number of implementations, the present disclosure relates to a method for fabricating an integrated circuit device. The method includes forming a primary regulator on a semiconductor substrate. The method further includes forming connection terminals on the substrate for input and output of the primary regulator. The method further includes forming a secondary regulator on the substrate. The method further includes forming connection terminals on the substrate for input and output of the secondary regulator. The method further includes forming an electrical connection between the output terminal of the primary regulator and the input terminal of the secondary regulator.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

Other aspects, features, and advantages of the present disclosure will become more fully apparent from the following detailed description, the appended claims, and the accompanying drawings in which like reference numerals identify similar or identical elements.

DETAILED DESCRIPTION OF SOME EMBODIMENTS

The headings provided herein, if any, are for convenience only and do not necessarily affect the scope or meaning of the claimed invention.

Figure 1:
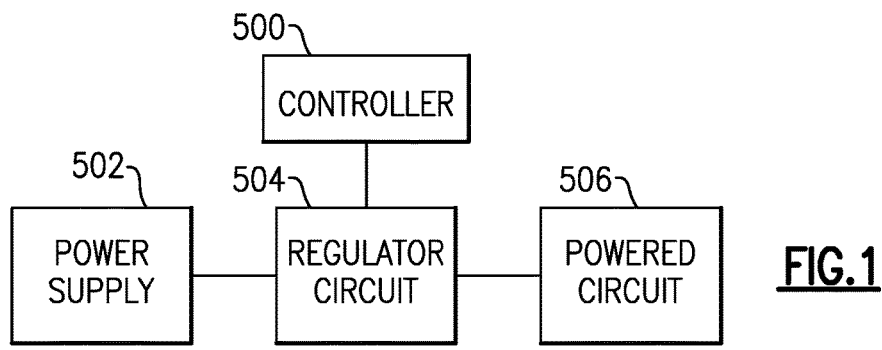
FIG. 1 schematically shows that in some implementations, a regulator circuit having one or more features as described herein can provide regulated power to a powered circuit.

The present disclosure relates to circuits and methodologies for regulating power that is being supplied to a powered circuit. FIG. 1 schematically shows a configuration where a regulator circuit 504 regulates power being supplied from a power supply 502 to a powered circuit 506. Such regulating functionality of the regulator circuit 504 can be controlled by a controller 500. Various examples of the components shown in FIG. 1 are described herein in greater detail.

Figure 2:
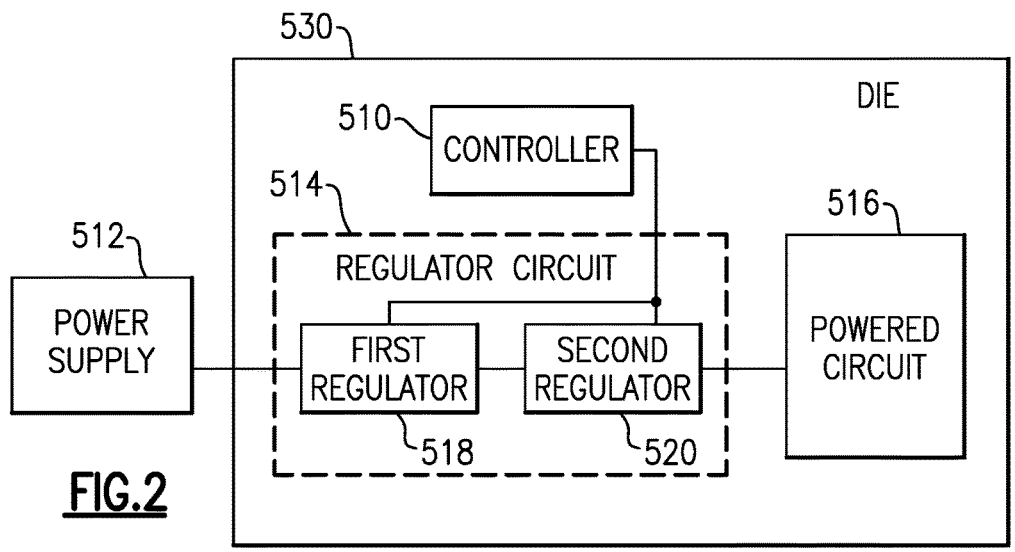
FIG. 2 shows that in some embodiments, the regulator of FIG. 1 can be implemented on a same die as that of the powered circuit.

FIG. 2 shows that in some embodiments, a regulator circuit 514 having one or more features as described herein can be fabricated on a die 530. Such a die can also provide a substrate for one or more circuits (e.g., 516) being powered with regulated power. A power supply 512 (e.g., a battery) is shown to provide for regulation by the regulator circuit 514.

FIG. 2 further shows that in some embodiments, the regulator circuit 514 can include first and second regulators (518, 520) that are arranged in a cascade configuration. Thus, the first regulator 518 is shown to receive power from the supply 512 and generate an output that can be provided as an input for the second regulator 520. The second regulator 520 is shown to generate an output that is provided to the powered circuit 516.

FIG. 2 further shows that in some embodiments, the regulator circuit 514 can be controlled by a controller 510 so as to provide one or more functionalities as described herein. Examples of such regulator circuit functionalities are described herein in greater detail. In some embodiments, some or all portions of the controller 510 can be implemented on the same die 530.

Figure 3:
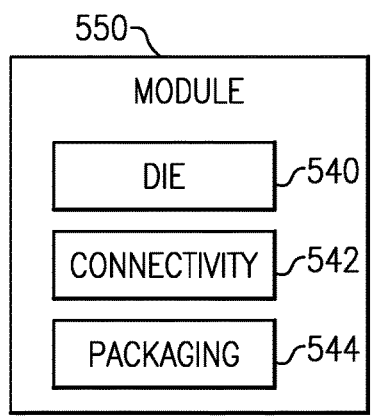
FIG. 3 shows that in some embodiments, a module can include the die having a regulator as described herein.

FIG. 3 shows that in some embodiments, a regulator circuit having one or more features as described herein can be part of a packaged module 550. Such a module can include a die 540 on which the regulator circuit is formed. The module 550 can also include other components. For example, a connectivity component 542 can be configured to provide power and signal connections for various circuits on the die 540. In another example, a packaging component 544 (e.g., molding) can be configured to provide protection for the circuits on the die 540. Other components can also be included in the module 550.

Figure 4:
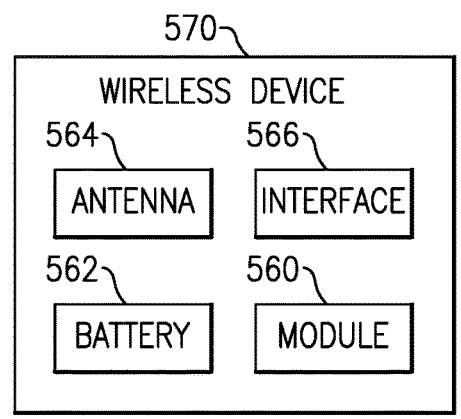
FIG. 4 shows that in some embodiments, a wireless device can include a module having a regulator as described herein.

FIG. 4 shows that in some embodiments, a regulator circuit having one or more features as described herein can be part of a wireless device 570. Such a device can include a module 560 such as the example module 550 of FIG. 3. The device 570 can also include other components. For example, a battery 562 can be installed on, or provided with, the wireless device 570 so as to provide power for various circuits within the module 560. In another example, an antenna 564 can be configured to facilitate transmission and reception of radio-frequency (RF) signals. In another example, an interface component 566 can be configured to facilitate use of the wireless device 570 by a user. Other components can also be included in the device 570.

Figure 5:
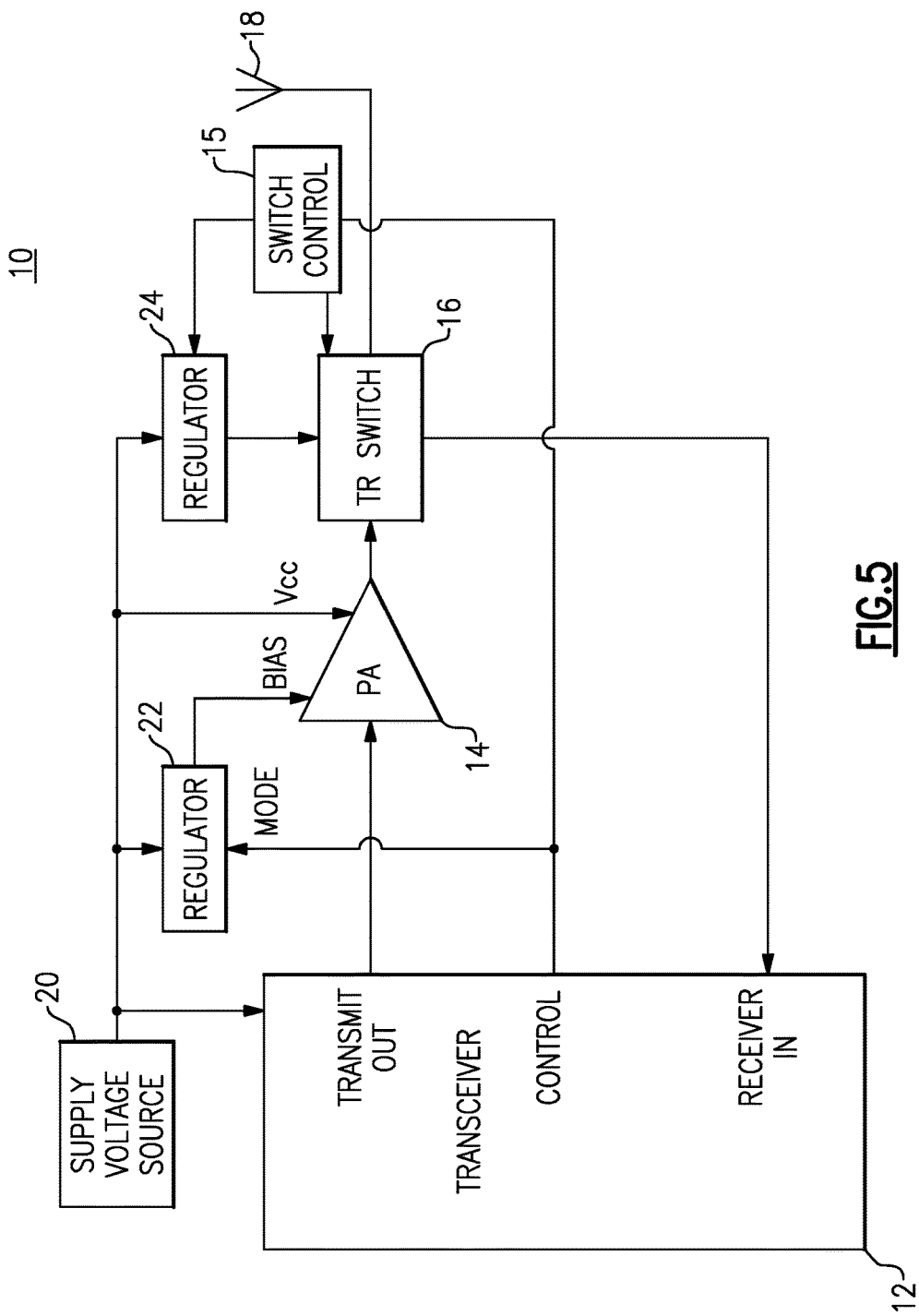
FIG. 5 is a high-level block diagram of part of an example mobile telephone or other transceiver powered from a voltage source such as a battery.

By way of a more specific example of a wireless device, a mobile telephone, or handset, 10 is shown in FIG. 5. Well-known and conventional details and features have been left out of FIG. 5. The handset 10 can include a transceiver 12, a power amplifier 14, a transmit-receive (TR) switch 16, and an antenna 18, all of which are well known to persons of ordinary skill in the art.

Powering the transceiver 12, amplifier 14, and the switch 16 is a supply voltage source 20, such as a lithium-ion battery. Power from the source 20 can be converted to a stabilized voltage by a regulator 22 and applied to the amplifier 14 to provide the supply to power transistors therein. Power from the source 20 can also be converted to stabilized voltage or voltages by a regulator 24 to control and configure the switch 16. One or more of the regulators 22 and 24, as described in more detail below, can be made tolerant of relatively high voltages from the voltage source 20 and can be made efficient by having very low idle current consumption when not providing significant current to their respective loads 14 and 16. In some embodiments, one or more of the regulators 22 and 24 may be integrated along with other circuits in the handset 10, such as in the transceiver 12.

In some embodiments, the transceiver 12 can be configured to also provide control signals to the regulators 22 and 24 to control the output voltages. For example, during transmit intervals, the TR switch 16 can be configured in response to a switch control block 15 to couple RF energy from the PA 14 to the antenna 18. Similarly, during receive intervals, the TR switch 16 can be configured in response to switch control block 15 to couple signals received by the antenna 18 to the receiver input of the transceiver 12. Mode control signal from the transceiver 12 to the regulator 22 may, for example, result in change in the output voltage from the regulator 22 to change the bias level to the PA 14 depending on the operating mode and modulation type of the signals being amplified by the PA 14. Such a control feature can accommodate situations where, for example, the bias voltage from the regulator 22 can be lower when PA 14 is amplifying GSM modulated signals, and the bias voltage can be higher when PA 14 is amplifying EDGE modulated signals.

Figure 6:
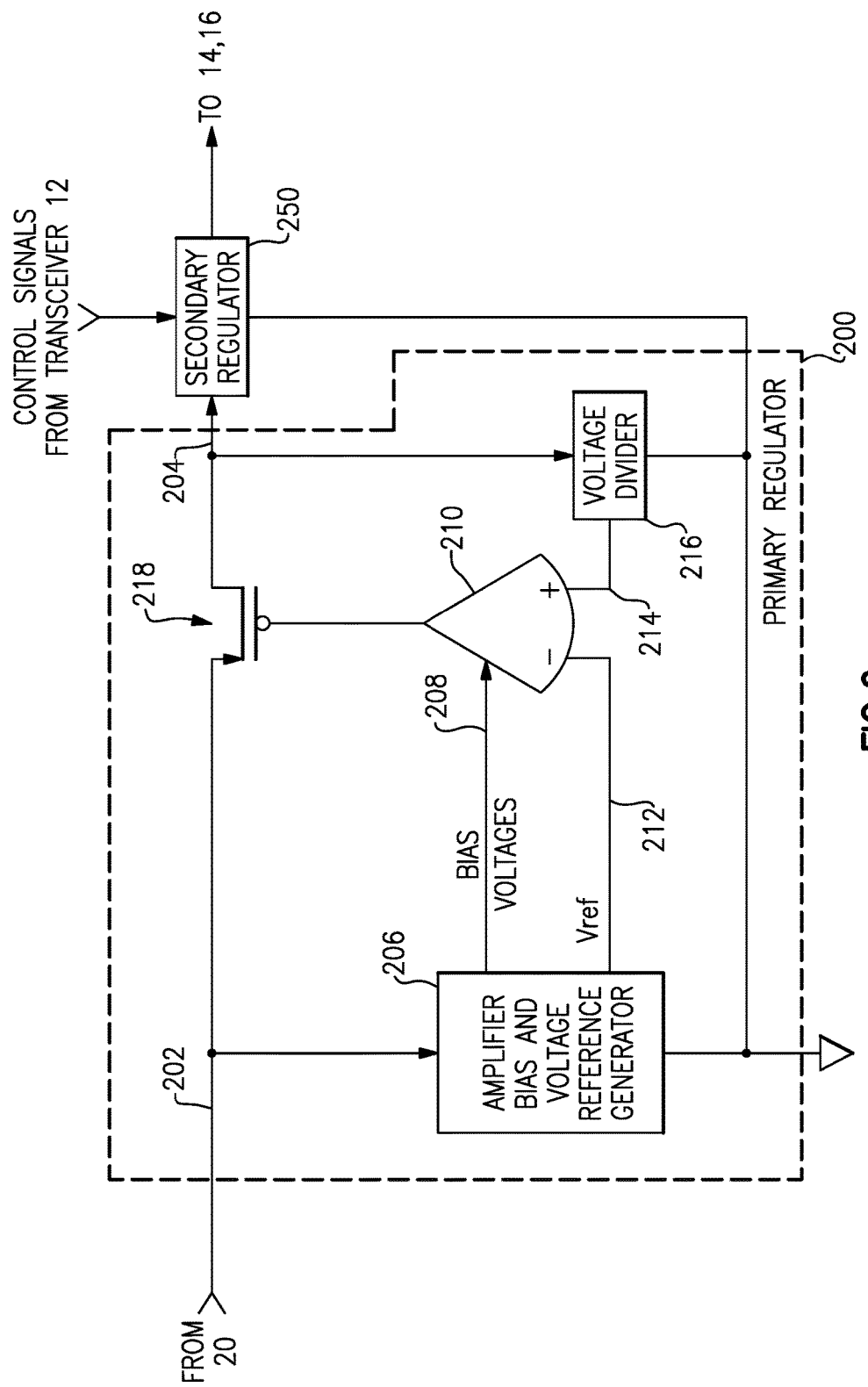
FIG. 6 is a simplified schematic diagram of a high-voltage tolerant, two-stage cascade voltage regulator in accordance with an example embodiment of the present disclosure.

In some implementations, a cascaded voltage regulator shown in FIG. 6 can be configured so as to be suitable to be used as the regulators 22 and 24 in FIG. 5. The first stage of the cascade regulator can be a primary regulator stage 200 that provides a regulated voltage on node 204 that is stepped down from the input voltage on lead 202. In turn, an optional second stage or secondary regulator 250 can step the voltage on node 204 to a lower voltage suitable for the load being powered, such as the bias input to PA 14 (FIG. 5). In some embodiments, the secondary regulator may be a conventional low dropout regulator with a selectable output voltage suitable for the bias supply of the TR switch 16, or a conventional DC-to-DC converter configured to provide bias signals to the PA 14 (FIG. 5). It is understood that circuitry in the handset 10 may be powered from the primary regulator 200 without the need for a secondary regulator 250.

In some embodiments, power from the voltage source 20 can be coupled to a bias and voltage reference generator 206 that provides appropriate bias voltages on bus 208 to amplifier 210 and a reference voltage, Vref, on lead 212 to the inverting input of amplifier 210. The non-inverting input of amplifier 210 receives a feedback voltage on lead 214 from voltage divider 216 that provides a fraction of the voltage on node 204 onto lead 214. Pass transistor 218 (e.g., a P-channel MOSFET (PFET)) can be controlled by the output of amplifier 210. Amplifier 210, voltage divider 216, and PFET 218 can form a closed-loop voltage regulator that provides a regulated voltage to output 204 determined by forcing the voltage on lead 214 to match the reference voltage Vref.

As described in more detail below, the amplifier bias and voltage reference generator 206 desirably consumes little power when the regulator 200 is not "in regulation" or is in a "bypass mode." In some embodiments, the output voltage on node 204 can be approximately equal to the input voltage on node 202 when in the bypass mode. In some embodiments, the output voltage on node 204 can be approximately equal to a selected voltage (Vselected) when in the regulation mode. In some implementations, the pass transistor 218 can receive a control signal from the amplifier 210 (which in turn can be controlled by the bias and voltage reference generator 206) so as to switch between the bypass and regulation modes. Such switching can be induced in a number of ways. For example, when the input voltage is greater than the selected voltage, the pass transistor 218 can be put into the regulation mode. Similarly, when the input voltage is at or less than the selected voltage, the pass transistor 218 can be put into the bypass mode. For example, if the regulated output voltage on node 204 is supposed to be 2.4 volts and the input voltage on lead 202 is 5 volts, then the regulator 200 is "in regulation" with the selected voltage being approximately 2.4 volts. If, however, the input voltage is at or below 2.4 volts, then the pass transistor 218 can switch its mode, connecting node 202 to node 204 with essentially no voltage drop across the transistor to effectively bypass the regulator 200.

In the foregoing example of switching between the bypass and regulation modes, the input voltage is utilized to determine which mode the regulator is in. Other parameters can also be utilized. For example, dropout voltage (Vdropout, typically defined as the smallest difference between the input voltage and output voltage for which the regulator can remain in regulation mode) can be compared to some value to allow switching between the modes.

Figure 7:
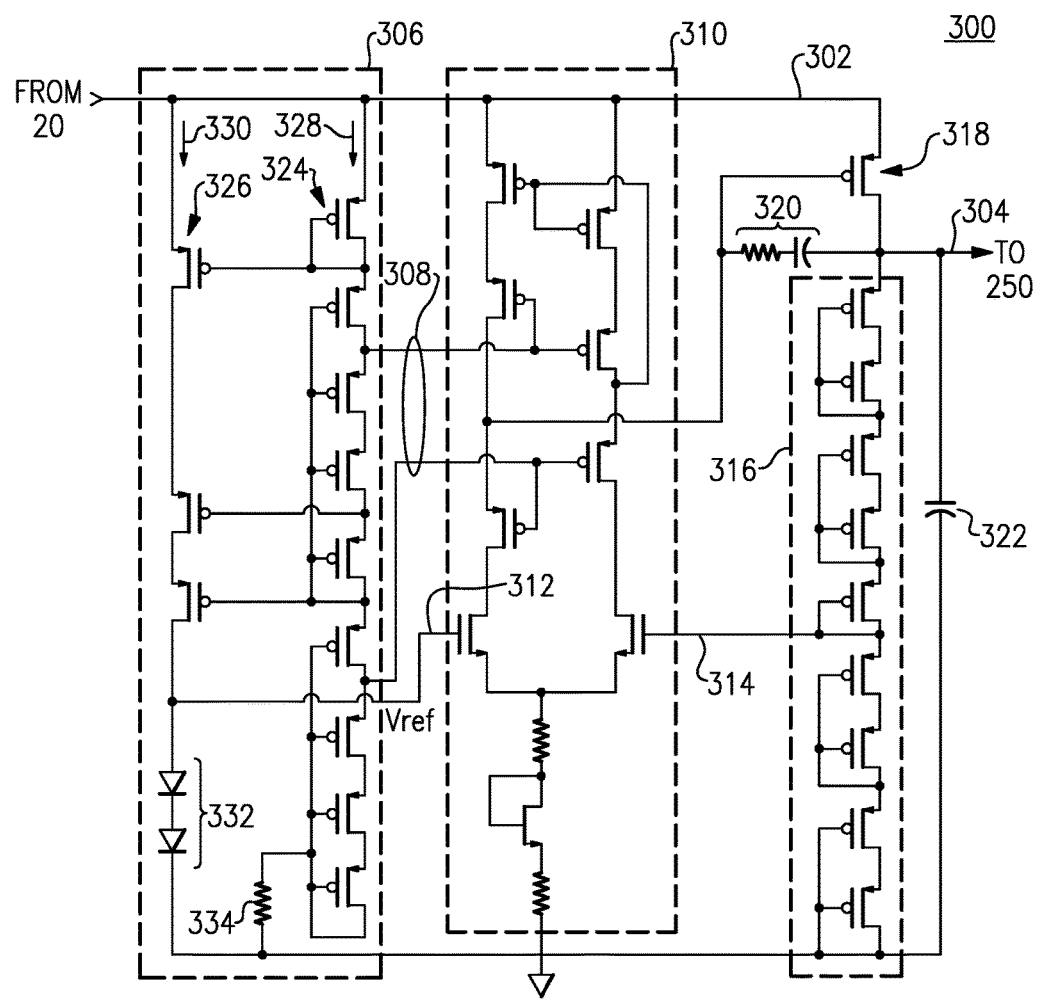
FIG. 7 shows an example of the first stage of the cascade, two-stage voltage regulator in greater detail and in accordance with the example embodiment.

In the bypass mode, it is desirable that the generator 206, as well as the other circuits in the regulator 200, consume as little power as possible so that battery life is extended. FIG. 7 outlines the primary regulator 200 in more detail to illustrate how the generator 206 operates at input voltages less than Vselected. The functioning of the regulator 200, described above, also applies to the regulator 300 in FIG. 7.

In FIG. 7, like-numbered reference numerals identify similar or identical elements in FIG. 6.

As in FIG. 6, power from supply 20 (FIG. 5) on lead 302 can power bias and reference voltage generator 306 to supply bias voltages via bus 308 to a differential amplifier 310. The generator 306 can also supply the reference voltage Vref on lead 312 to the amplifier 310. As will be explained in more detail below, the generator 306 can utilize series-coupled transistors (e.g., diode connected FETs), the number and sizes of which provide the needed bias and reference voltages, as is known to persons skilled in the art.

As shown, the pass transistor 318 can be coupled to a stabilization network 320 having a series resistor and capacitor to provide stability of the regulator 300 (e.g., to prevent oscillation due to the feedback loop as described above). Other techniques for stabilization may be employed. In addition to the network 320, a bypass capacitor 322 can be provided to further improve the stability of the regulator 300 and to lower the output impedance of the regulator.

In some embodiments, a voltage divider 316 can be configured to provide one or more functionalities associated with the voltage divider 216 of FIG. 6. In the example shown, the voltage divider is depicted as having nine transistors in series to step-down the voltage provided to node 304. Other numbers of transistors and/or configurations are also possible. While the transistors may be replaced with resistors, current through the divider 316 can be made substantially smaller when transistors are used as compared to a resistor implementation, such as integrated polysilicon or metal resistors, for a given area of silicon or other semiconductor.

In FIG. 7, the example generator 306 is depicted as having two strings 324, 326 of transistors. String 324 (depicted as having series-coupled transistors) has various taps that provide the bias voltages to amplifier 310 via bus 308. String 326 (depicted as having cascode-coupled transistors) is coupled to string 324 to mirror the current 328 flowing in string 324. The mirrored current 330 passes through diodes 332 to develop the voltage Vref.

When the voltage on lead 302 is greater than Vselected, the value of resistor 334 and the input voltage on lead 302 can substantially determine the current 328 and, because of the mirroring operation, the current 330 can also be substantially determined by the input voltage on lead 302 and the resistor 334. Thus, the voltage of Vref (ignoring temperature effects) may vary. Consequently, while the regulator is "in regulation," the output voltage on node 304 may also vary. As will be described in more detail in connection with FIG. 8, the voltage Vref can be made substantially independent of the input voltage and temperature.

Should the voltage on lead 302 fall below Vselected, the currents in generator 306 may be reduced to the minimum amount that will allow the regulator 300 to operate correctly in the bypass mode. To do so, operating the transistors in string 324 in the sub-threshold mode can be desirable (e.g., the MOSFETs operate with a gate-to-source voltage less than the design threshold voltage of the MOSFETs). Generally, the threshold voltage for a MOSFET is the minimum gate-to-source voltage that allows significant current to flow between the drain and source of the MOSFET. However, applying a sub-threshold gate-to-source voltage can still allow the MOSFET to conduct some current, albeit less, possibly much less, than when voltages greater than the threshold voltage are applied. Using very low-leakage MOSFET integrated circuit technology such as silicon-on-insulator (SOI) technology, sub-threshold operation is feasible, with bias voltages on bus 308 and the reference voltage Vref reduced accordingly. Thus, operating the regulator 300 with very little current being consumed within the regulator itself is possible. It is understood that at least one of the transistors in the stack 324 should operate in sub-threshold mode and that sub-threshold operation might occur when the input voltage is greater than Vselected as well as at or below Vselected.

Figure 8:
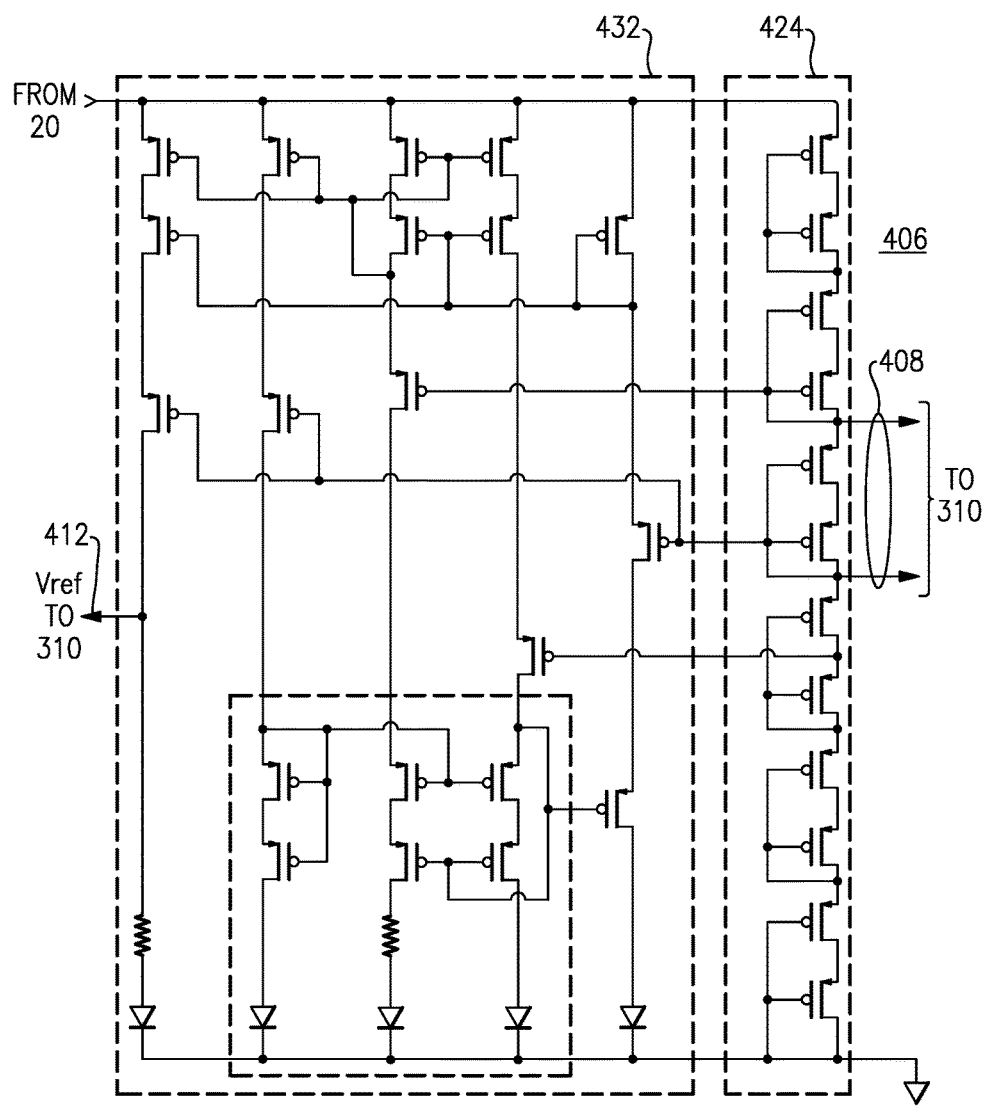
FIG. 8 shows an alternative embodiment of a bias and reference voltage generator shown in FIG. 7.

An alternative embodiment of the generator 306 is shown in FIG. 8. Here the generator 406 can include a transistor stack 424, similar to the transistor stack 324 in FIG. 7, providing the needed bias voltages to amplifier 310 (FIG. 7) via bus 408. Instead of a second transistor stack 326 (FIG. 7) to generate the reference voltage Vref, a bandgap voltage reference 432 can provide a voltage reference Vref on lead 412 that is relatively immune to temperature and input voltage variations. Thus, the regulator 300 (FIG. 7) incorporating the bias and reference voltage generator 406 can provide an output voltage that does not change substantially with input voltage (assuming the input voltage is greater than Vselected). As with the transistor stack 324 in FIG. 7, the transistors in stack 424 may remain in sub-threshold for input voltages below Vselected.

By way of examples, a primary regulator 200 implemented using the circuitry shown in FIG. 7, along with a conventional LDO regulator 250, has been fabricated in an SOI 130 nm CMOS process. A static current consumption of approximately 3 µA has been measured for the combined regulator 200 and LDO regulator 250 (with the regulator 250 in standby mode) at room temperature and with an input voltage of approximately Vselected. Current flow in the transistor stack 324 is calculated to be approximately 50 nA.

Figure 9:
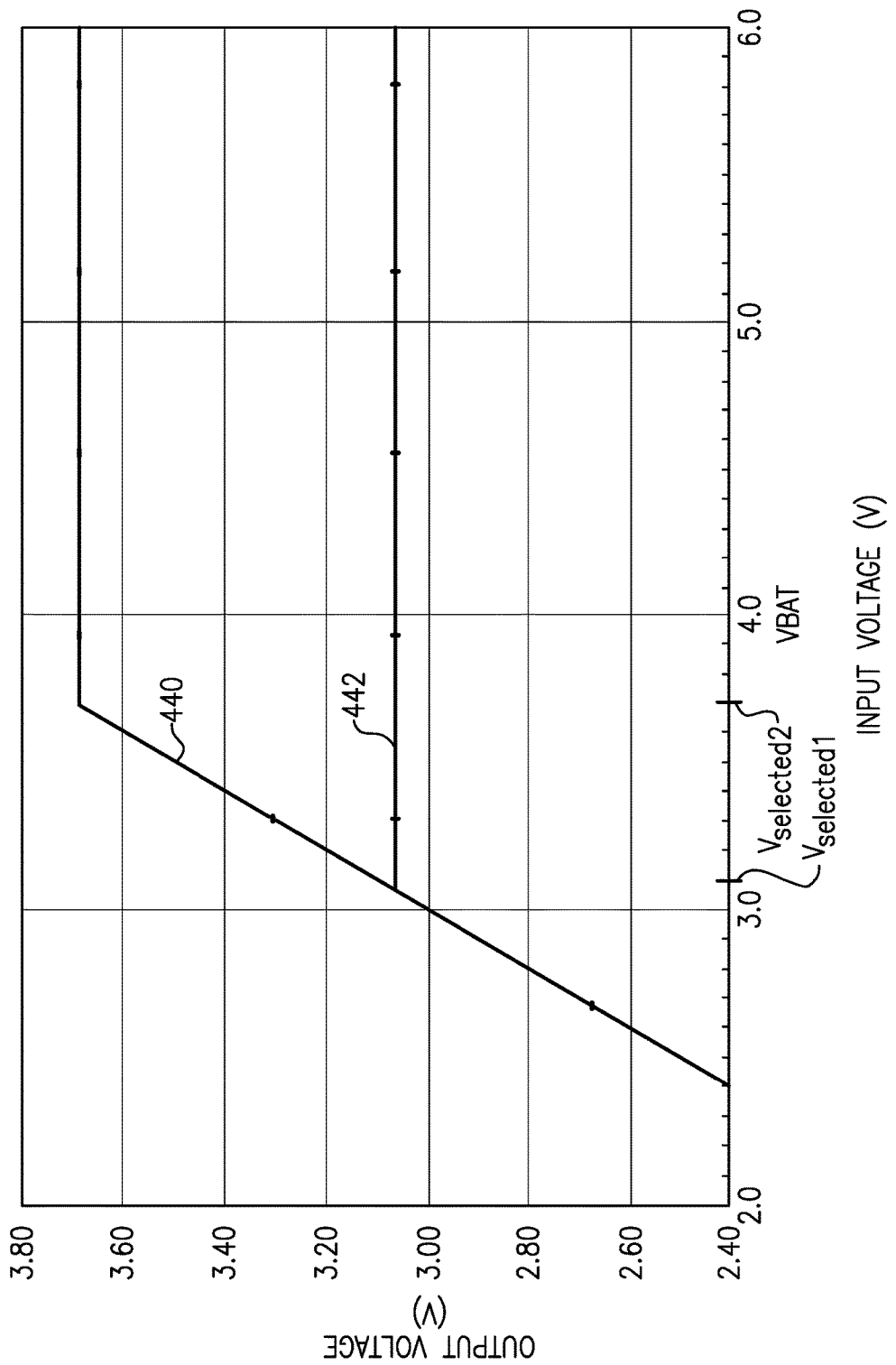
FIG. 9 shows a plot of output voltage of the first stage of the regulator over an example range of input voltages to the regulator.

FIG. 9 illustrates the performance of two example embodiments of the regulator 300 of FIG. 7. Plot 442 illustrates the performance of the primary regulator in regulator 22 of FIG. 5. Here, the output of the primary regulator tracks the input voltage until the input voltage reaches Vselected1 here about 3.1 volts, and then the output voltage remains substantially constant for input voltages greater than Vselected1. Similarly, plot 440 illustrates the performance of the first stage in regulator 24 in FIG. 5. This regulator has a selected voltage Vselected2 of approximately 3.7 volts. In the foregoing example, the PA regulator can deliver 20 mA or more of current to its load.

Figure 10:
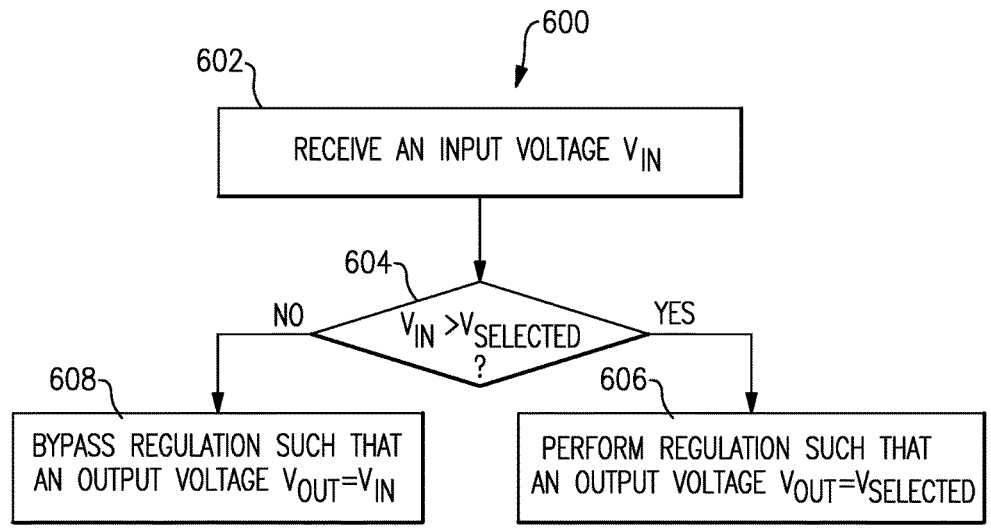
FIG. 10 shows a process that can be implemented to provide regulated voltage in a manner having one or more features described herein.

FIG. 10 shows a process 600 that can be implemented to provide regulation of voltage in a manner that provides one or more features as described herein. In block 602, an input voltage Vin can be received (e.g., from a power source such as a battery). In a decision block 604, the process 600 can determine whether the input voltage for a regulator is greater than a selected voltage Vselected. If "Yes," the regulator can be put into a regulate mode so as to yield a desired output voltage Vout (block 606). For example, regulation can be performed so that the output voltage Vout is substantially constant at approximately Vselected. If "No," the regulator can be put into a bypass mode so as to yield a desired output voltage Vout (block 608). For example, bypassing can be performed so that the output voltage Vout is substantially equal to the input voltage Vin.

Figure 11:
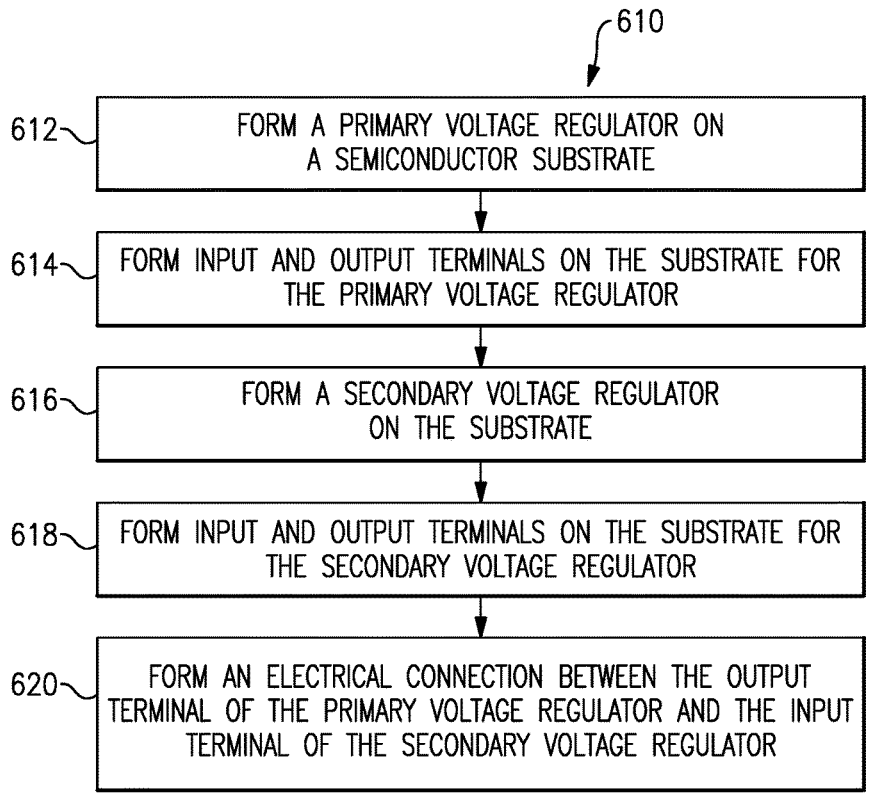
FIG. 11 shows a process that can be implemented to fabricate a regulator circuit having one or more features described herein.

As described herein, a regulator circuit may or may not be on a same die as a circuit being powered. In the context of a configuration where such a regulator circuit is on the same die as the powered circuit, FIG. 11 shows a process 610 that can be implemented to fabricate such a die. In block 612, a primary voltage regulator can be formed on a semiconductor substrate. In block 614, connection terminals for input and output of the primary regulator can be formed on the substrate. In block 616, a secondary voltage regulator can be formed on the substrate. In block 618, connection terminals for input and output of the secondary regulator can be formed on the substrate. In block 620, an electrical connection between the output terminal of the primary voltage regulator and the input terminal of the secondary voltage regulator can be formed. In some embodiments, one or more additional processes can be implemented to, for example, singulate and package the die.

Reference herein to "one embodiment" or "an embodiment" means that a particular feature, structure, or characteristic described in connection with the embodiment can be included in at least one embodiment of the present disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

One or more features associated with the present disclosure may be implemented as circuit-based processes, including possible implementation as a single integrated circuit (such as an ASIC or an FPGA), a multichip module, a single card, or a multi-card circuit pack. As would be apparent to one skilled in the art, various functions of circuit elements may also be implemented as processing blocks in a software program. Such software may be employed in, for example, a digital signal processor, micro-controller, or general-purpose computer.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the example methods set forth herein are not necessarily required to be performed in the order described, and the order of the steps of such methods should be understood to be merely an example. Likewise, additional steps may be included in such methods, and certain steps may be omitted or combined, in methods consistent with various embodiments of the present disclosure.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However, and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

It will be further understood that various changes in the details, materials, and arrangements of the parts which have been described and illustrated in order to explain the nature of this disclosure may be made by those skilled in the art without departing from the scope of the invention as expressed in the following claims.

What is claimed is:

1. A method of fabricating an integrated circuit, the method comprising:
   forming a primary regulator on a semiconductor substrate, including fabricating a switch, fabricating an amplifier for controlling the switch, and fabricating a voltage generator for biasing the amplifier to operate the primary regulator in a bypass mode or in a regulating mode, including forming a first stack of transistors that generate one or more bias voltages of the amplifier and forming a second stack of transistors that mirror a current through the first stack to generate a reference voltage of the amplifier;
   forming an input terminal and an output terminal of the primary regulator on the semiconductor substrate;
   forming a secondary regulator on the substrate;

forming an input terminal and an output terminal of the secondary regulator on the semiconductor substrate; and forming an electrical connection between the output terminal of the primary regulator and the input terminal of the secondary regulator.

2. The method of claim 1 further comprising forming a powered circuit on the semiconductor substrate, and forming an electrical connection between the output terminal of the secondary regulator and the powered circuit.

3. The method of claim 2 wherein forming the powered circuit includes fabricating a transmit-receive switch.

4. The method of claim 2 wherein forming the powered circuit includes fabricating a power amplifier.

5. The method of claim 1 wherein forming the first stack includes fabricating a first plurality of field-effect transistors in series between the input terminal of the primary regulator and a ground node.

6. The method of claim 5 wherein forming the second stack includes fabricating a second plurality of field-effect transistors in series between the input terminal of the primary regulator and the ground node.

7. The method of claim 5 wherein fabricating the voltage generator further includes forming a bandgap voltage circuit that provides a reference voltage to the amplifier.

8. The method of claim 1 wherein forming the primary regulator further includes fabricating a divider circuit that is between the output terminal of the primary regulator and a ground node and that provides a divided voltage to the amplifier.

9. The method of claim 8 wherein fabricating the divider circuit includes forming a plurality of diode-connected field-effect transistors.

10. The method of claim 1 wherein fabricating the switch includes forming a p-channel metal oxide semiconductor transistor.

11. A method of fabricating an integrated circuit, the method comprising:

forming a regulator circuit on a semiconductor substrate, the regulator circuit operable in a regulating mode and in a bypass mode, and including an input terminal for receiving an input voltage, an output terminal for providing power, a switch connected between the input terminal and the output terminal, an amplifier that controls the switch, and a voltage generator that biases the amplifier based on the input voltage and including a first stack of transistors that generate one or more bias voltages for the amplifier and a second stack of transistors that generate a reference voltage for the amplifier by mirroring a current flowing through the first stack;

forming a powered circuit on the semiconductor substrate; and forming one or more electrical connections between the output terminal of the regulator circuit and the powered circuit so as to allow the regulator circuit to provide power to the powered circuit both when the regulator circuit is operating in the regulating mode and when the regulator circuit is operating in the bypass mode.

12. The method of claim 11 wherein forming the powered circuit includes fabricating a power amplifier.

13. The method of claim 11 wherein forming the regulator circuit further includes fabricating the first stack as a first plurality of field-effect transistors that are in series between the input terminal and a ground node.

14. The method of claim 13 wherein forming the regulator circuit further includes fabricating the second stack as a second plurality of field-effect transistors that are in series between the input terminal and the ground node.

15. The method of claim 13 wherein forming the regulator circuit further includes fabricating a bandgap voltage circuit that provides a reference voltage to the amplifier.

16. The method of claim 11 wherein forming the regulator circuit further includes fabricating a divider circuit that is between the output terminal and a ground node and that provides a divided voltage to the amplifier.

17. The method of claim 16 wherein fabricating the divider circuit includes forming a plurality of diode-connected field-effect transistors.

18. The method of claim 17 wherein forming the regulator circuit further includes fabricating the switch as a p-channel metal oxide semiconductor transistor.

19. A method of fabricating a voltage regulator on an integrated circuit, the method comprising:

forming an input terminal for receiving a battery voltage;

forming an output terminal for providing an output voltage;

forming a field-effect transistor including a source connected to the input terminal and a drain connected to the output terminal;

forming an amplifier including an output connected to a gate of the field-effect transistor; and forming a voltage generator that receives the battery voltage from the input terminal and that biases the amplifier to operate the voltage regulator in a regulation mode or in a bypass mode based on a voltage level of the battery voltage, including forming a first stack of transistors that generate one or more bias voltages of the amplifier and forming a second stack of transistors that mirror a current through the first stack to generate a reference voltage of the amplifier.

20. The method of claim 19 wherein forming the first stack of transistors includes fabricating a first stack of field-effect transistors that are in series between the input terminal and a ground node.

* * * * *